United States Patent
Lee et al.

(10) Patent No.: US 10,553,790 B1
(45) Date of Patent: Feb. 4, 2020

(54) METHOD OF MANUFACURING A MAGNETIC MEMORY DEVICE

(71) Applicant: SAMSUNG ELECTRONICS CO., LTD., Suwon-si, Gyeonggi-do (KR)

(72) Inventors: Joonmyoung Lee, Anyang-si (KR); Ung Hwan Pi, Hwaseong-si (KR); Eunsun Noh, Yongin-si (KR); Yong Sung Park, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/440,461

(22) Filed: Jun. 13, 2019

Related U.S. Application Data

(63) Continuation of application No. 16/434,478, filed on Jun. 7, 2019.

(30) Foreign Application Priority Data

Nov. 9, 2018 (KR) .......................... 10-2018-0137036

(51) Int. Cl.
*H01L 43/08* (2006.01)
*H01L 43/12* (2006.01)
*H01L 43/02* (2006.01)
*H01L 27/22* (2006.01)

(52) U.S. Cl.
CPC ............ *H01L 43/12* (2013.01); *H01L 27/228* (2013.01); *H01L 43/02* (2013.01)

(58) Field of Classification Search
CPC ......... H01L 21/67213; H01L 21/76802; H01L 21/76877; H01L 27/22; H01L 27/222; H01L 43/02; H01L 43/04; H01L 43/06; H01L 43/08; H01L 43/10; H01L 43/12
See application file for complete search history.

(56) References Cited

U.S. PATENT DOCUMENTS

| | | | |
|---|---|---|---|
| 8,598,016 B2 | 12/2013 | Yalamanchili et al. | |
| 9,768,229 B2 | 9/2017 | Braganca et al. | |
| 9,972,502 B2 | 5/2018 | Lee et al. | |
| 10,270,028 B1* | 4/2019 | Tien .................... | H01L 43/12 |

(Continued)

FOREIGN PATENT DOCUMENTS

| KR | 10-0781432 B1 | 12/2007 |
|---|---|---|
| KR | 10-2017-0054255 A | 5/2017 |
| KR | 10-1873695 B1 | 7/2018 |

OTHER PUBLICATIONS

Oh, Y., et al., "Field-free switching of perpendicular magnetization through spin-orbit torque in antiferromagnet/ferromagnet/oxide structures", *Nat Nanotechnol.* Oct. 2016;11(10):878-884. doi: 10.1038/nnano.2016.109. Epub Jul. 11, 2016.

*Primary Examiner* — Cuong Q Nguyen
(74) *Attorney, Agent, or Firm* — Lee & Morse, P.C.

(57) ABSTRACT

A magnetic memory device includes a first magnetic tunnel junction pattern on a substrate, a second magnetic tunnel junction pattern on the first magnetic tunnel junction pattern, and a conductive line between the first magnetic tunnel junction pattern and the second magnetic tunnel junction pattern. The conductive line is configured such that a current flowing through the conductive line flows in parallel to an interface between the conductive line and each of the first and second magnetic tunnel junction patterns.

20 Claims, 12 Drawing Sheets

(56) References Cited

U.S. PATENT DOCUMENTS

| | | | |
|---|---|---|---|
| 2016/0130693 A1* | 5/2016 | Sawada | H01L 43/12 |
| | | | 204/192.25 |
| 2017/0117027 A1 | 4/2017 | Braganca et al. | |
| 2018/0145691 A1 | 5/2018 | Manipatruni et al. | |
| 2019/0123262 A1* | 4/2019 | Lee | H01L 43/02 |
| 2019/0148632 A1* | 5/2019 | Lee | H01L 43/12 |
| | | | 438/3 |
| 2019/0259940 A1* | 8/2019 | Yang | H01L 27/222 |
| 2019/0259941 A1* | 8/2019 | Yang | H01L 43/10 |

* cited by examiner

METHOD OF MANUFACURING A MAGNETIC MEMORY DEVICE

CROSS-REFERENCE TO RELATED APPLICATIONS

This is a continuation application based on pending application Ser. No. 16/434,478, filed Jun. 7, 2019, the entire contents of which is hereby incorporated by reference.

Korean Patent Application No. 10-2018-0137036, filed on Nov. 9, 2018, in the Korean Intellectual Property Office, and entitled: "Magnetic Memory Devices," is incorporated by reference herein in its entirety.

BACKGROUND

1. Field

Embodiments relate to a semiconductor device and, more particularly, to magnetic memory devices including magnetic tunnel junctions.

2. Description of the Related Art

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. The magnetic memory devices may emerge as next-generation semiconductor memory devices because of their high-speed and/or non-volatile characteristics.

Generally, a magnetic memory device may include a magnetic tunnel junction (MTJ). The magnetic tunnel junction may include two magnetic layers and an insulating layer disposed between the two magnetic layers. A resistance value of the magnetic tunnel junction may be changed depending on magnetization directions of the two magnetic layers. For example, when the magnetization directions of the two magnetic layers are anti-parallel to each other, the magnetic tunnel junction may have a relatively high resistance value. When the magnetization directions of the two magnetic layers are parallel to each other, the magnetic tunnel junction may have a relatively low resistance value. The magnetic memory device may read/write data using a difference between the resistance values of the magnetic tunnel junction. Highly integrated and/or low-power magnetic memory devices have been increasingly demanded with the development of the electronic industry. Thus, various researches are being conducted to satisfy these demands.

SUMMARY

In an aspect, a magnetic memory device may include a first magnetic tunnel junction pattern on a substrate, a second magnetic tunnel junction pattern on the first magnetic tunnel junction pattern, and a conductive line between the first magnetic tunnel junction pattern and the second magnetic tunnel junction pattern. The conductive line may be configured such that a current flowing through the conductive line flows in parallel to an interface between the conductive line and each of the first and second magnetic tunnel junction patterns.

In an aspect, a magnetic memory device may include a first magnetic tunnel junction pattern on a substrate, a second magnetic tunnel junction pattern on the first magnetic tunnel junction pattern, and a conductive line between the first magnetic tunnel junction pattern and the second magnetic tunnel junction pattern. The conductive line may be configured to apply spin-orbit torque to the first and second magnetic tunnel junction patterns.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, embodiments will be described in detail with reference to the accompanying drawings.

Figure 1:
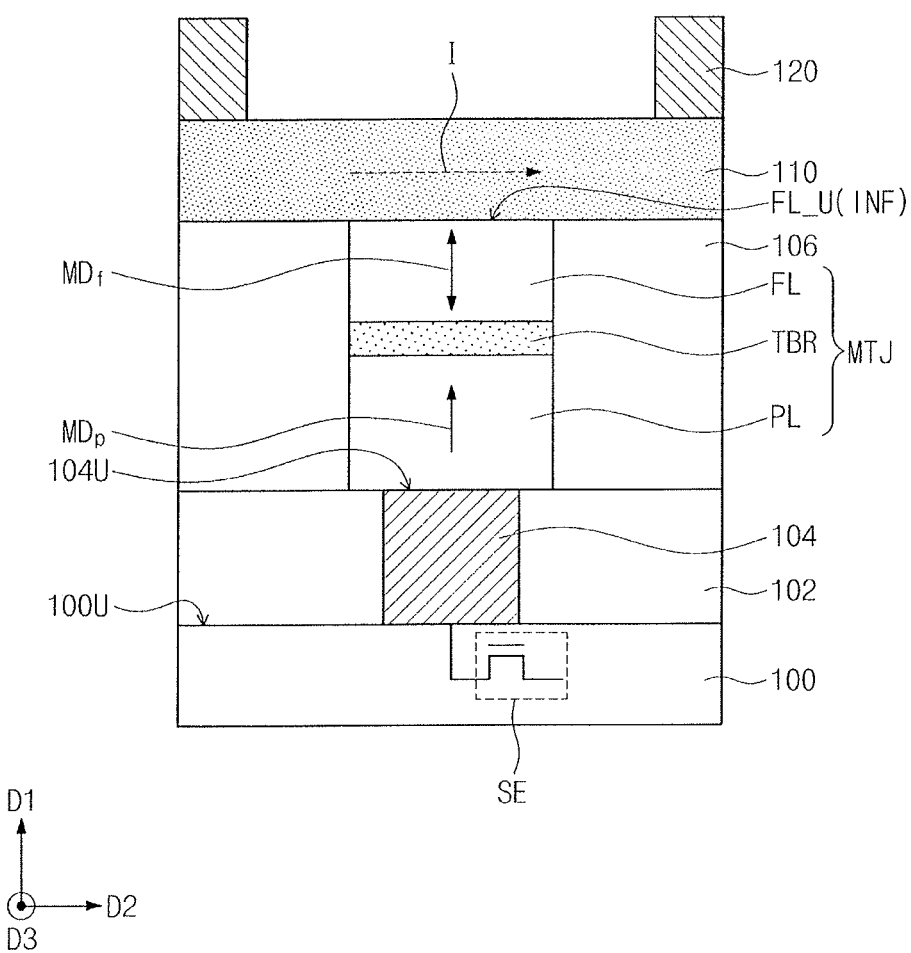
FIG. 1 illustrates a cross-sectional view of a magnetic memory device according to some embodiments.

FIG. 1 is a cross-sectional view illustrating a magnetic memory device according to some embodiments.

Referring to FIG. 1, a lower interlayer insulating layer 102 may be disposed on a substrate 100, and a lower contact plug 104 may be disposed in the lower interlayer insulating layer 102 so as to be electrically connected to the substrate 100. The substrate 100 may include a semiconductor substrate and a selection element SE formed on the semiconductor substrate. The semiconductor substrate may include, e.g., silicon (Si), silicon on an insulator (SOI), silicon-germanium (SiGe), germanium (Ge), or gallium-arsenic (GaAs), and the selection element SE may be a field effect transistor or a diode. The lower contact plug 104 may penetrate the lower interlayer insulating layer 102 and may be electrically connected to one terminal of the selection element SE. The lower contact plug 104 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide). The lower interlayer insulating layer 102 may include at least one of, e.g., an oxide layer, a nitride layer, or an oxynitride layer.

A magnetic tunnel junction pattern MTJ may be disposed on the lower interlayer insulating layer 102 and may be connected to the lower contact plug 104. The magnetic tunnel junction pattern MTJ may be disposed on a top surface 104U of the lower contact plug 104 and may be in contact with the top surface 104U of the lower contact plug 104. The magnetic tunnel junction pattern MTJ may include a reference magnetic pattern PL, a tunnel barrier pattern TBR, and a free magnetic pattern FL, which are sequentially stacked in a first direction D1 perpendicular to a top surface 100U of the substrate 100. The tunnel barrier pattern TBR may be disposed between the reference magnetic pattern PL and the free magnetic pattern FL. For example, the tunnel barrier pattern TBR may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the reference magnetic pattern PL and the free magnetic pattern FL may include at least one magnetic layer.

The reference magnetic pattern PL may be disposed between the lower contact plug 104 and the tunnel barrier pattern TBR and may be in contact with the top surface 104U of the lower contact plug 104. The reference magnetic pattern PL may include a reference layer having a magnetization direction $MD_p$ fixed in one direction. The free magnetic pattern FL may be spaced apart from the reference magnetic pattern PL with the tunnel barrier pattern TBR interposed therebetween. The free magnetic pattern FL may include a free layer having a magnetization direction $MD_f$ changeable to be parallel or anti-parallel to the magnetization direction $MD_p$ of the reference magnetic pattern PL. The magnetization directions $MD_p$ and $MD_f$ of the reference magnetic pattern PL and the free magnetic pattern FL may be substantially perpendicular to an interface between the tunnel barrier pattern TBR and the free magnetic pattern FL. In this case, each of the reference magnetic pattern PL and the free magnetic pattern FL may include at least one of an intrinsic perpendicular magnetic material or an extrinsic perpendicular magnetic material.

The intrinsic perpendicular magnetic material may include a material that has a perpendicular magnetization property even though an external factor does not exist. The intrinsic perpendicular magnetic material may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. The extrinsic perpendicular magnetic material may include a material that has an intrinsic horizontal magnetization property but has a perpendicular magnetization property by an external factor. For example, the extrinsic perpendicular magnetic material may have the perpendicular magnetization property by magnetic anisotropy induced by a junction of the tunnel barrier pattern TBR and the reference magnetic pattern PL (or the free magnetic pattern FL). The extrinsic perpendicular magnetic material may include, for example, CoFeB.

An insulating layer 106 may be disposed on the lower interlayer insulating layer 102 to cover the magnetic tunnel junction pattern MTJ. The insulating layer 106 may cover a sidewall of the magnetic tunnel junction pattern MTJ and may expose a top surface of the magnetic tunnel junction pattern MTJ. The top surface of the magnetic tunnel junction pattern MTJ may correspond to a top surface FL_U of the free magnetic pattern FL. A top surface 106U of the insulating layer 106 may be substantially coplanar with the top surface FL_U of the free magnetic pattern FL. In other words, a height (or level) of the top surface 106U of the insulating layer 106 may be substantially the same as a height (or level) of the top surface FL_U of the free magnetic pattern FL. In the present specification, the term 'height' may mean a vertical distance measured from the top surface 100U of the substrate 100. The insulating layer 106 may include at least one of, e.g., an oxide layer, a nitride layer, or an oxynitride layer.

A conductive line 110 may be disposed on the insulating layer 106 and may be connected to the magnetic tunnel junction pattern MTJ. The free magnetic pattern FL may be disposed between the tunnel barrier pattern TBR and the conductive line 110. The conductive line 110 may be in contact with the top surface FL_U of the free magnetic pattern FL. The conductive line 110 may extend from the top surface FL_U of the free magnetic pattern FL onto the top surface 106U of the insulating layer 106 in a second direction D2 parallel to the top surface 100U of the substrate 100.

The conductive line 110 may be configured to apply spin-orbit torque (SOT) to the magnetic tunnel junction pattern MTJ, e.g., a spin-orbit torque (SOT) scheme may be used to realize a high-speed switching operation of the magnetic tunnel junction pattern MTJ. For example, a current I may flow through the conductive line 110. Here, the current I may be an in-plane current flowing through the conductive line 110. The conductive line 110 may be configured such that the current I flows in parallel to an interface INF between the conductive line 110 and the magnetic tunnel junction pattern MTJ. The interface INF between the conductive line 110 and the magnetic tunnel junction pattern MTJ may correspond to an interface between the conductive line 110 and the free magnetic pattern FL (i.e., to the top surface FL_U of the free magnetic pattern FL). The conductive line 110 may be configured to show strong spin-orbit interaction. The current I flowing through the conductive line 110 may cause accumulation of spin-polarized charge carriers (e.g., electrons) near the magnetic tunnel junction pattern MTJ by the spin-orbit interaction in the conductive line 110. A spin-orbit field may be generated by the accumulated charge carriers. The spin-orbit field may be parallel to the interface INF between the conductive line 110 and the magnetic tunnel junction pattern MTJ and may be perpendicular to a direction of the in-plane current I. For example, the in-plane current I may flow in the second direction D2, and the spin-orbit field may be parallel to a third direction D3 which is parallel to the top surface 100U of the substrate 100 and is perpendicular to the second direction D2. The spin-orbit torque may be applied to the magnetic tunnel junction pattern MTJ by the spin-orbit field. The magnetization direction MDf of the free magnetic pattern FL may be switched by the spin-orbit torque.

In some embodiments, the conductive line 110 may include a heavy metal or a material doped with a heavy metal. For example, the conductive line 110 may include 'A' or 'M' doped with 'B'. The 'A' may include yttrium (Y), zirconium (Zr), niobium (Nb), molybdenum (Mo), technetium (Tc), ruthenium (Ru), rhodium (Rh), palladium (Pd), cadmium (Cd), indium (In), antimony (Sb), tellurium (Te), hafnium (Hf), tantalum (Ta, including high-resistance amorphous β-Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), and/or any combination thereof. The 'B' may include at least one of vanadium (V), chromium (Cr), manganese (Mn), iron (Fe), cobalt (Co), nickel (Ni), phosphorus (P), sulfur (S), zinc (Zn), gallium (Ga), germanium (Ge), arsenic (As), selenium (Se), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), antimony (Sb), tellurium (Te), iodine (I), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), or ytterbium (Yb). The 'M' may include at least one of aluminum (Al), titanium (Ti), vanadium (V), chromium (Cr), manganese (Mn), copper (Cu), zinc (Zn), silver (Ag), hafnium (Hf), tantalum (Ta), tungsten (W), rhenium (Re), platinum (Pt), gold (Au), mercury (Hg), lead (Pb), silicon (Si), gallium (Ga), gallium-manganese (GaMn), or gallium-arsenic (GaAs).

Interconnection lines 120 may be disposed on the insulating layer 106 and may be connected to the conductive line 110. For example, the interconnection lines 120 may be horizontally spaced apart from each other (e.g., in the second direction D2) on the conductive line 110. The interconnection lines 120 may be connected to different portions of the conductive line 110, respectively. The interconnection lines 120 may include, e.g., a metal.

Figure 2:
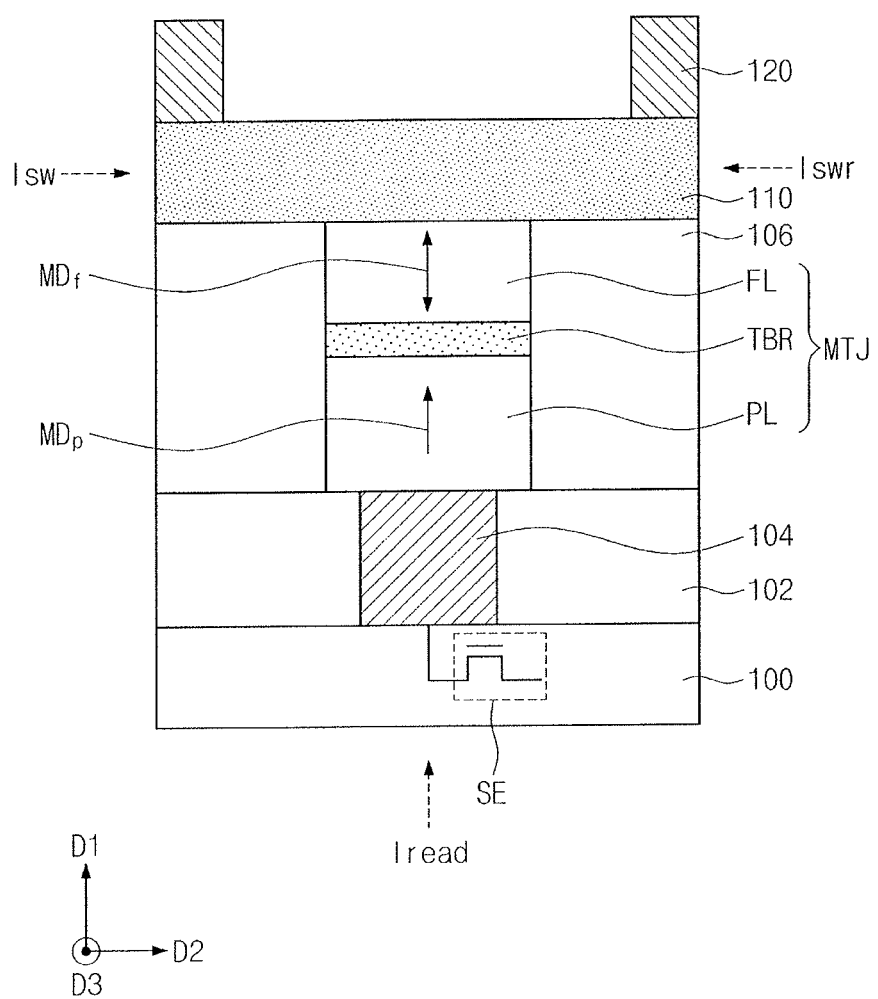
FIG. 2 illustrates a conceptual view of a method of operating the magnetic memory device of FIG. 1.

FIG. 2 is a conceptual view illustrating a method of operating the magnetic memory device of FIG. 1.

Referring to FIG. 2, the conductive line 110 may be configured to apply the spin-orbit torque to the magnetic tunnel junction pattern MTJ, as described above. The magnetization direction $MD_f$ of the free magnetic pattern FL in the magnetic tunnel junction pattern MTJ may be switched by the spin-orbit torque. In other words, a switching operation (e.g., a write operation and an erase operation) of the magnetic tunnel junction pattern MTJ may be performed based on the spin-orbit torque.

For example, a write current Isw may flow in the second direction D2 through the conductive line 110. The write current Isw may be an in-plane current flowing through the conductive line 110 and may flow in parallel to the interface INF between the conductive line 110 and the magnetic tunnel junction pattern MTJ. The spin-orbit torque may be applied to the magnetic tunnel junction pattern MTJ by the spin-orbit field generated by the write current Isw, and the magnetization direction $MD_f$ of the free magnetic pattern FL may be switched in parallel (or anti-parallel) to the magnetization direction $MD_p$ of the reference magnetic pattern PL by the spin-orbit torque.

For example, an erase current Iswr may flow in a direction anti-parallel to the second direction D2 (i.e., a direction opposite to the second direction D2) through the conductive line 110. The erase current Iswr may be an in-plane current flowing through the conductive line 110 and may flow in parallel to the interface INF between the conductive line 110 and the magnetic tunnel junction pattern MTJ. The erase current Iswr may be a reverse current of the write current Isw. A direction of the spin-orbit field generated by the erase current Iswr may be opposite to a direction of the spin-orbit field generated by the write current Isw. The spin-orbit torque may be applied to the magnetic tunnel junction pattern MTJ by the spin-orbit field generated by the erase current Iswr, and the magnetization direction $MD_f$ of the free magnetic pattern FL may be switched in anti-parallel (or parallel) to the magnetization direction $MD_p$ of the reference magnetic pattern PL by the spin-orbit torque.

A read operation of the magnetic tunnel junction pattern MTJ may be performed by a similar method to those of spin-transfer torque memories. For example, a read current Iread may flow through the magnetic tunnel junction pattern MTJ in a direction perpendicular to a surface (or plane) of the magnetic tunnel junction pattern MTJ (e.g., in the first direction D1). The read current Iread may be controlled by the selection element SE connected to the magnetic tunnel junction pattern MTJ. A resistance state of the magnetic tunnel junction pattern MTJ may be detected by the read current Tread. For example, whether the magnetic tunnel junction pattern MTJ is in a high-resistance state or a low-resistance state may be detected by the read current Iread.

Figure 3:
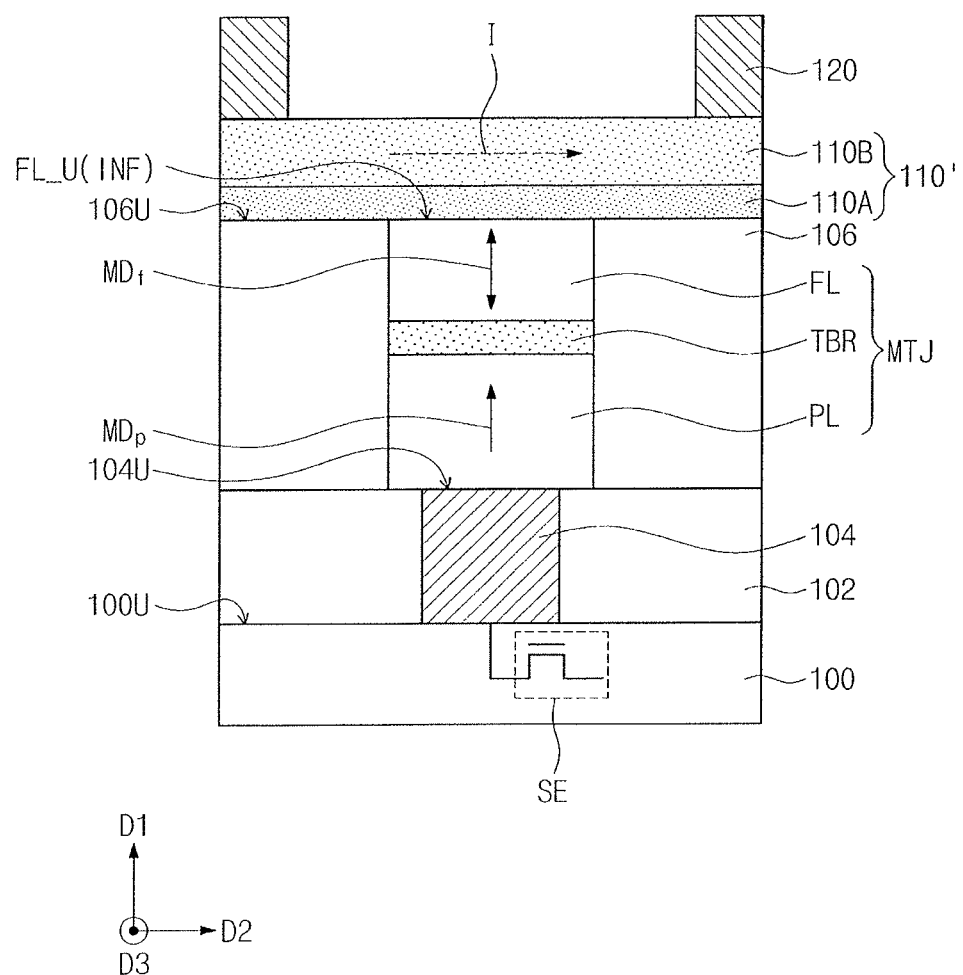
FIG. 3 illustrates a cross-sectional view of a magnetic memory device according to a modified example of some embodiments.

FIG. 3 is a cross-sectional view illustrating a magnetic memory device according to a modified example of some embodiments. Hereinafter, differences between the present modified example and the above embodiments described with reference to FIGS. 1 and 2 will be mainly described for the purpose of ease and convenience in explanation.

Referring to FIG. 3, a conductive line 110' may be disposed on the insulating layer 106 and may be connected to the magnetic tunnel junction pattern MTJ. According to the present embodiment, the conductive line 110' may have a multi-layered structure. The conductive line 110' may include a first conductive line 110A and a second conductive line 110B, which are sequentially stacked on the insulating layer 106. The first conductive line 110A may be disposed between the magnetic tunnel junction pattern MTJ and the second conductive line 110B and may be in contact with the top surface FL_U of the free magnetic pattern FL. The first conductive line 110A may extend from the top surface FL_U of the free magnetic pattern FL onto the top surface 106U of the insulating layer 106 in the second direction D2. The second conductive line 110B may extend in the second direction D2 in parallel to the first conductive line 110A.

The first conductive line 110A may include a non-magnetic metal element, and the second conductive line 110B may include a magnetic element. For example, the first conductive line 110A may include at least one of copper (Cu), silver (Ag), gold (Au), platinum (Pt), tantalum (Ta), titanium (Ti), or tungsten (W). For example, the second conductive line 110B may include at least one of iron (Fe), cobalt (Co), or nickel (Ni) and may further include at least one of platinum (Pt), palladium (Pd), manganese (Mn), yttrium (Y), chromium (Cr), ruthenium (Ru), rhodium (Rh), tungsten (W), tantalum (Ta), boron (B), bismuth (Bi), germanium (Ge), tellurium (Te), selenium (Se), iridium (Ir), lead (Pb), nitrogen (N), or oxygen (O). The materials of the first and second conductive lines 110A and 110B are not limited to the materials described above.

The conductive line 110' may be configured to apply spin-orbit torque to the magnetic tunnel junction pattern MTJ. According to the present embodiment, a current I may flow through the conductive line 110' including the first conductive line 110A and the second conductive line 110B. Here, the current I may be an in-plane current flowing through the conductive line 110'. The conductive line 110' may be configured such that the current I flows in parallel to an interface INF between the conductive line 110' and the magnetic tunnel junction pattern MTJ. In the present embodiment, the second conductive line 110B may be a magnetic layer and may have a magnetic moment polarized in a specific direction. A direction of the magnetic moment may be parallel or perpendicular to the interface INF between the conductive line 110' and the magnetic tunnel junction pattern MTJ or may be inclined with respect to the interface INF between the conductive line 110' and the magnetic tunnel junction pattern MTJ. The direction of the magnetic moment of the second conductive line 110B may be selected depending on a direction of an easy axis of the free magnetic pattern FL in the magnetic tunnel junction pattern MTJ.

A portion of the in-plane current I flowing through the conductive line 110' may be spin-polarized by the second conductive line 110B. For example, charge carriers (e.g., electrons) in the second conductive line 110B may be spin-polarized along the direction of the magnetic moment of the second conductive line 110B. The spin-polarized charge carriers may flow from the second conductive line 110B into the first conductive line 110A and may be accumulated in the first conductive line 110A near the magnetic tunnel junction pattern MTJ. The spin-orbit torque may be applied to the magnetic tunnel junction pattern MTJ by the accumulation of the spin-polarized charge carriers. The magnetization direction $MD_f$ of the free magnetic pattern FL may be switched by the spin-orbit torque.

A method of operating the magnetic memory device according to the present embodiment may be substantially the same as the method of operating the magnetic memory device described with reference to FIG. 2.

Figure 4:
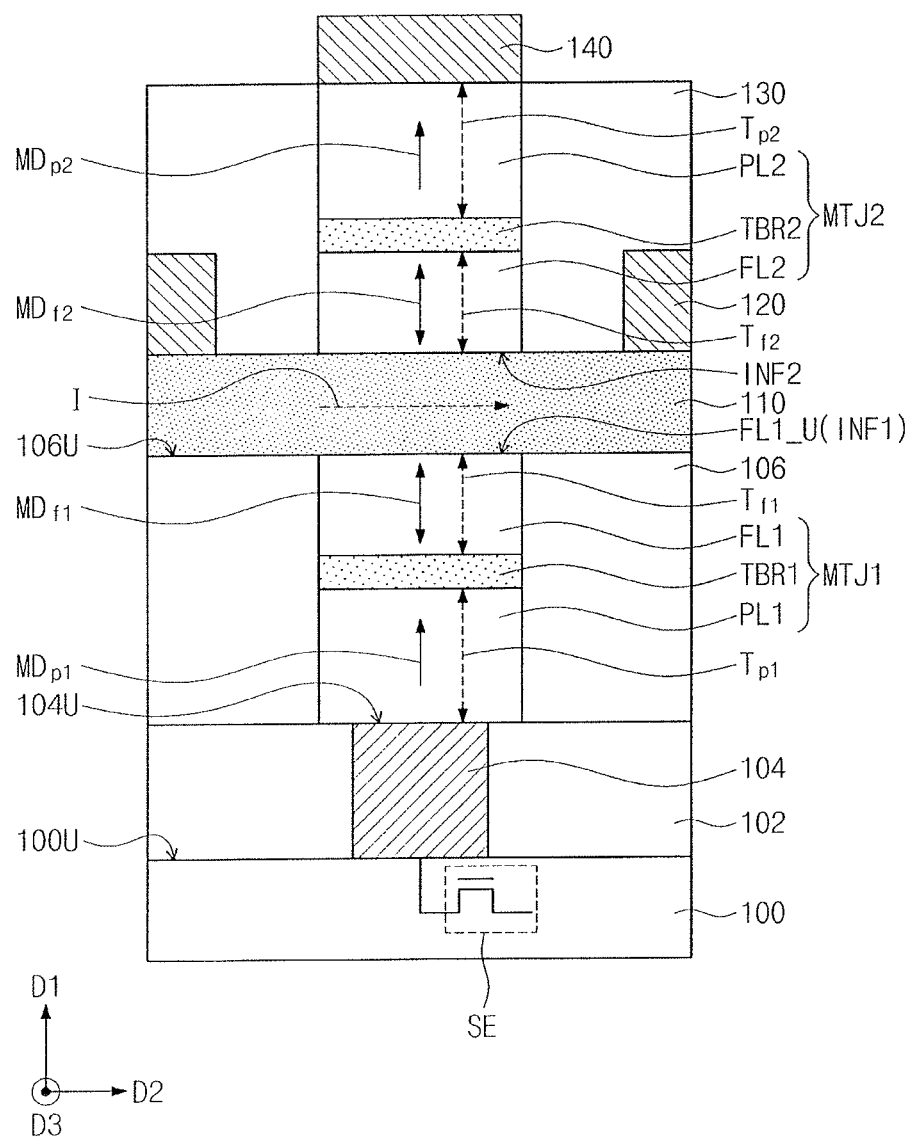
FIG. 4 illustrates a cross-sectional view of a magnetic memory device according to some embodiments.

FIG. 4 is a cross-sectional view illustrating a magnetic memory device according to some embodiments. Hereinafter, the descriptions to the same components and/or features as in the embodiments of FIG. 1 will be omitted or mentioned briefly for the purpose of ease and convenience in explanation.

Referring to FIG. 4, the lower interlayer insulating layer 102 may be disposed on the substrate 100, and the lower contact plug 104 may be disposed in the lower interlayer insulating layer 102 so as to be electrically connected to the substrate 100. The substrate 100 may include a semiconductor substrate and a selection element SE formed on the semiconductor substrate. The lower contact plug 104 may penetrate the lower interlayer insulating layer 102 and may be electrically connected to one terminal of the selection element SE.

A first magnetic tunnel junction pattern MTJ1 may be disposed on the lower interlayer insulating layer 102 and may be connected to the lower contact plug 104. The first magnetic tunnel junction pattern MTJ1 may be disposed on a top surface 104U of the lower contact plug 104 and may be in contact with the top surface 104U of the lower contact plug 104. The first magnetic tunnel junction pattern MTJ1 may include a first reference magnetic pattern PL1, a first tunnel barrier pattern TBR1, and a first free magnetic pattern FL1, which are sequentially stacked in the first direction D1. The first tunnel barrier pattern TBR1 may be disposed between the first reference magnetic pattern PL1 and the first free magnetic pattern FL1. The first reference magnetic pattern PL1, the first tunnel barrier pattern TBR1 and the first free magnetic pattern FL1 may be substantially the same as the reference magnetic pattern PL, the tunnel barrier pattern TBR and the free magnetic pattern FL described with reference to FIG. 1, respectively.

The first reference magnetic pattern PIA may be disposed between the lower contact plug 104 and the first tunnel barrier pattern TBR1 and may be in contact with the top surface 104U of the lower contact plug 104. The first reference magnetic pattern PL1 may include a reference layer having a magnetization direction $MD_{p1}$ fixed in one direction. The first free magnetic pattern FL1 may be spaced apart from the first reference magnetic pattern PL1 with the first tunnel barrier pattern TBR1 interposed therebetween. The first free magnetic pattern FL1 may include a free layer having a magnetization direction $MD_{f1}$ changeable to be parallel or anti-parallel to the magnetization direction $MD_{p1}$ of the first reference magnetic pattern PL1. The magnetization directions $MD_{p1}$ and $MD_{f1}$ of the first reference magnetic pattern PL1 and the first free magnetic pattern FL1 may be substantially perpendicular to an interface between the first tunnel barrier pattern TBR1 and the first free magnetic pattern FL1.

The insulating layer 106 may be disposed on the lower interlayer insulating layer 102 to cover the first magnetic tunnel junction pattern MTJ1. The insulating layer 106 may be substantially the same as the insulating layer 106 described with reference to FIG. 1. The insulating layer 106 may cover a sidewall of the first magnetic tunnel junction pattern MTJ1 and may expose a top surface of the first magnetic tunnel junction pattern MTJ1. The top surface of the first magnetic tunnel junction pattern MTJ1 may correspond to a top surface FL1_U of the first free magnetic pattern FL1. A top surface 106U of the insulating layer 106 may be substantially coplanar with the top surface FL1_U of the first free magnetic pattern FL1. In other words, a height (or level) of the top surface 106U of the insulating layer 106 may be substantially the same as a height (or level) of the top surface FL1_U of the first free magnetic pattern FL1.

The conductive line 110 may be disposed on the insulating layer 106 and may be connected to the first magnetic tunnel junction pattern MTJ1. The first free magnetic pattern FL1 may be disposed between the first tunnel barrier pattern TBR1 and the conductive line 110. The conductive line 110 may be in contact with the top surface FL1_U of the first free magnetic pattern FL1. The conductive line 110 may extend from the top surface FL1_U of the first free magnetic pattern FL1 onto the top surface 106U of the insulating layer 106 in the second direction D2.

A second magnetic tunnel junction pattern MTJ2 may be disposed on the conductive line 110. The conductive line 110 may be disposed between the first magnetic tunnel junction pattern MTJ1 and the second magnetic tunnel junction pattern MTJ2. The second magnetic tunnel junction pattern MTJ2 may include a second free magnetic pattern FL2, a second tunnel barrier pattern TBR2, and a second reference magnetic pattern PL2, which are sequentially stacked in the first direction D1. The second tunnel barrier pattern TBR2 may be disposed between the second reference magnetic pattern PL2 and the second free magnetic pattern FL2. For example, the second tunnel barrier pattern TBR2 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the second reference magnetic pattern PL2 and the second free magnetic pattern FL2 may include at least one magnetic layer.

The second free magnetic pattern FL2 may be disposed between the conductive line 110 and the second tunnel barrier pattern TBR2 and may be in contact with the conductive line 110, e.g., the conductive line 110 may be directly between the first and second free magnetic patterns FL1 and FL2. The second reference magnetic pattern PL2 may be spaced apart from the second free magnetic pattern FL2 with the second tunnel barrier pattern TBR2 interposed therebetween. The second reference magnetic pattern PL2 may include a reference layer having a magnetization direction $MD_{p2}$ fixed in one direction, and the second free magnetic pattern FL2 may include a free layer having a magnetization direction $MD_{f2}$ changeable to be parallel or anti-parallel to the magnetization direction $MD_{p2}$ of the second reference magnetic pattern PL2. The magnetization directions $MD_{p2}$ and $MD_{f2}$ of the second reference magnetic pattern PL2 and the second free magnetic pattern FL2 may be substantially perpendicular to an interface between the second tunnel barrier pattern TBR2 and the second free magnetic pattern FL2. In this case, each of the second reference magnetic pattern PL2 and the second free magnetic pattern FL2 may include at least one of an intrinsic perpendicular magnetic material or an extrinsic perpendicular magnetic material. The intrinsic perpendicular magnetic material and the extrinsic perpendicular magnetic material may be the same as described with reference to FIG. 1.

The first magnetic tunnel junction pattern MTJ1 may be configured to have a different switching property from that of the second magnetic tunnel junction pattern MTJ2. In some embodiments, the first free magnetic pattern FL1 may be different from the second free magnetic pattern FL2 in terms of material, composition of material, and/or thickness. For example, the first free magnetic pattern FL1 may include a different material from that of the second free magnetic pattern FL2. In another example, the first free magnetic pattern FL1 may include the same material as the second free magnetic pattern FL2, but a composition of the material in the first free magnetic pattern FL1 may be different from a composition of the material in the second free magnetic pattern FL2. In still another example, each of the first and second free magnetic patterns FL1 and FL2 may have a thickness in the first direction D1, and a thickness $T_{f1}$ of the first free magnetic pattern FL1 may be different from a thickness $T_{f2}$ of the second free magnetic pattern FL2 (i.e., $T_{f1} \neq T_{f2}$).

In some embodiments, the first reference magnetic pattern PL1 may also be different from the second reference magnetic pattern PL2 in terms of material, composition of material, and/or thickness. For example, the first reference magnetic pattern PL1 may include a different material from that of the second reference magnetic pattern PL2. In another example, the first reference magnetic pattern PL1 may include the same material as the second reference magnetic pattern PL2, but a composition of the material in the first reference magnetic pattern PL1 may be different from a composition of the material in the second reference magnetic pattern PL2. In still another example, each of the first and second reference magnetic patterns PL1 and PL2 may have a thickness in the first direction D1, and a thickness $T_{p1}$ of the first reference magnetic pattern PL1 may be different from a thickness $T_{p2}$ of the second reference magnetic pattern PL2 (i.e., $T_{p1} \neq T_{p2}$).

The conductive line 110 may be configured to apply spin-orbit torque to the first and second magnetic tunnel junction patterns MTJ1 and MTJ2. The conductive line 110 may be substantially the same as the conductive line 110 described with reference to FIG. 1. For example, a current I may flow through the conductive line 110. Here, the current I may be an in-plane current flowing through the conductive line 110. The current I may flow in parallel to an interface INF1 between the conductive line 110 and the first magnetic tunnel junction pattern MTJ1 and an interface INF2 between the conductive line 110 and the second magnetic tunnel junction pattern MTJ2. The spin-orbit field may be generated by the spin-orbit interaction in the conductive line 110. The spin-orbit field may be parallel to the interface INF1 between the conductive line 110 and the first magnetic tunnel junction pattern MTJ1 and the interface INF2 between the conductive line 110 and the second magnetic tunnel junction pattern MTJ2 and may be perpendicular to a direction of the in-plane current I. For example, the in-plane current I may flow in the second direction D2, and the spin-orbit field may be parallel to the third direction D3. The spin-orbit torque may be applied to the first and second magnetic tunnel junction patterns MTJ1 and MTJ2 by the spin-orbit field. The magnetization directions $MD_{f1}$ and $MD_{f2}$ of the first and second free magnetic patterns FL1 and FL2 may be switched by the spin-orbit torque.

When the switching property of the first magnetic tunnel junction pattern MTJ1 is different from the switching property of the second magnetic tunnel junction pattern MTJ2, a magnitude of the spin-orbit torque required to switch the magnetization direction $MD_{f1}$ of the first free magnetic pattern FL1 may be different from a magnitude of the spin-orbit torque required to switch the magnetization direction $MD_{f2}$ of the second free magnetic pattern FL2. The magnitude of the spin-orbit torque may be dependent on a magnitude (e.g., amount) of the current I flowing through the conductive line 110. The magnitude of the spin-orbit torque may be changed by changing the magnitude of the current I. Thus, switching operations of the magnetization directions $MD_{f1}$ and $MD_{f2}$ of the first and second free magnetic patterns FL1 and FL2 may be controlled by changing the magnitude of the current I flowing through the conductive line 110.

The interconnection lines 120 may be disposed on the insulating layer 106 and may be connected to the conductive line 110. The interconnection lines 120 are the same as the interconnection lines 120 described with reference to FIG. 1. For example, the interconnection lines 120 may be horizontally spaced apart from each other (e.g., in the second direction D2) on the conductive line 110. The second magnetic tunnel junction pattern MTJ2 may be disposed between the interconnection lines 120. The interconnection lines 120 may be connected to different portions of the conductive line 110, respectively.

An upper interlayer insulating layer 130 may be disposed on the insulating layer 106 to cover the conductive line 110 and the interconnection lines 120. The upper interlayer insulating layer 130 may cover a sidewall of the second magnetic tunnel junction pattern MTJ2. The upper interlayer insulating layer 130 may include at least one of, e.g., an oxide layer, a nitride layer, or an oxynitride layer.

An upper interconnection line 140 may be disposed on the second magnetic tunnel junction pattern MTJ2. The second magnetic tunnel junction pattern MTJ2 may be disposed between the conductive line 110 and the upper interconnection line 140 and may be electrically connected to the upper interconnection line 140. The upper interconnection line 140 may include, for example, a metal.

Figure 5:
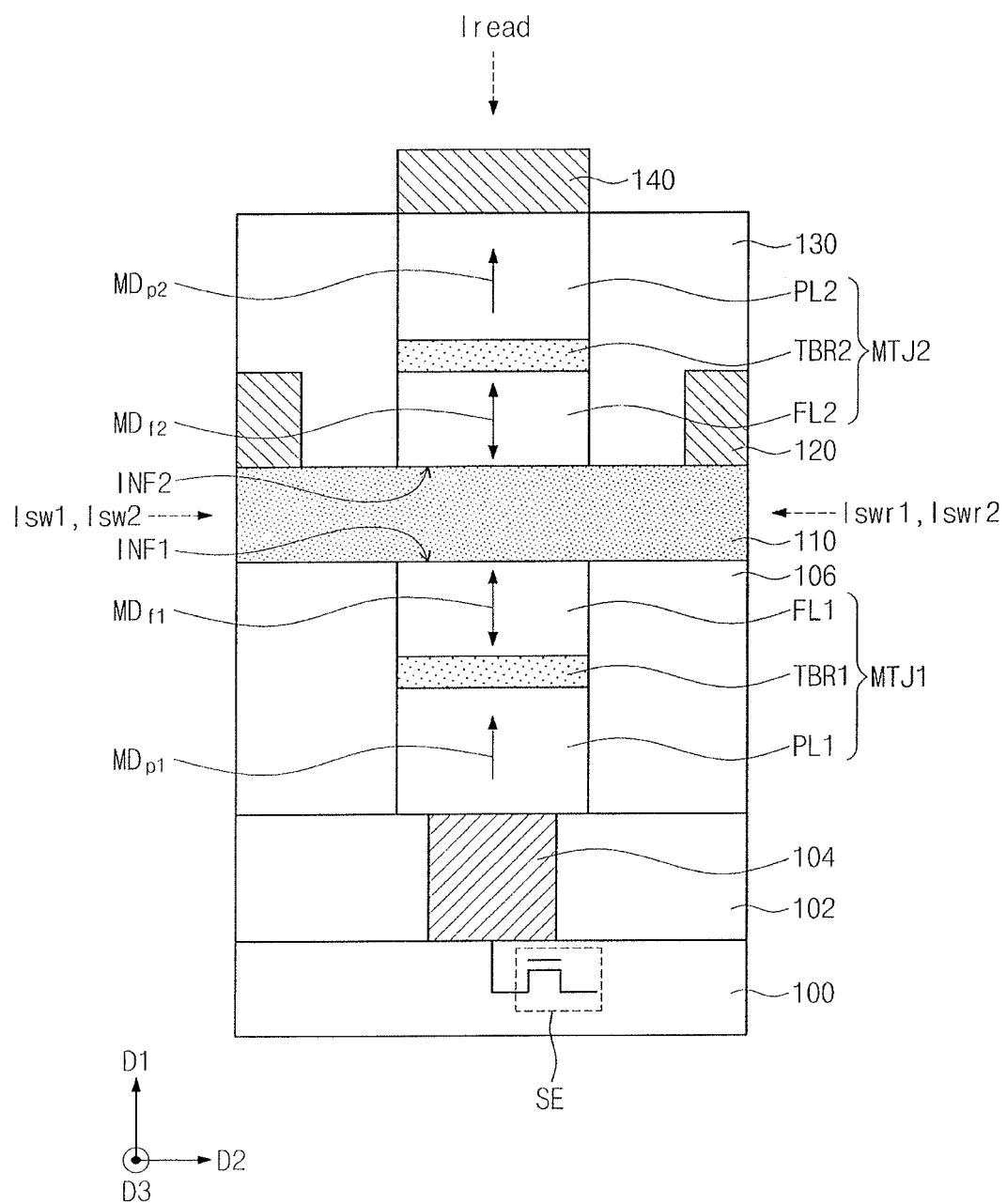
FIG. 5 illustrates a conceptual view of a method of operating the magnetic memory device of FIG. 4.

FIG. 5 is a conceptual view illustrating a method of operating the magnetic memory device of FIG. 4.

Referring to FIG. 5, the conductive line 110 may be configured to apply the spin-orbit torque to the first and second magnetic tunnel junction patterns MTJ1 and MTJ2, as described above. The magnetization directions $MD_{f1}$ and $MD_{f2}$ of the first and second free magnetic patterns FL1 and FL2 in the first and second magnetic tunnel junction patterns MTJ1 and MTJ2 may be switched by the spin-orbit torque. In other words, switching operations (e.g., write operations and erase operations) of the first and second magnetic tunnel junction patterns MTJ1 and MTJ2 may be performed based on the spin-orbit torque. When the first and second magnetic tunnel junction patterns MTJ1 and MTJ2 are configured to have different switching properties, the switching operations of the first and second magnetic tunnel junction patterns MTJ1 and MTJ2 may be controlled by changing the magnitude of the current I flowing through the conductive line 110.

For example, a first write current Isw1 may flow in the second direction D2 through the conductive line 110. The first write current Isw1 may be an in-plane current flowing through the conductive line 110 and may flow in parallel to the interface INF1 between the conductive line 110 and the first magnetic tunnel junction pattern MTJ1 and the interface INF2 between the conductive line 110 and the second magnetic tunnel junction pattern MTJ2. Spin-orbit torque may be applied to the first and second magnetic tunnel junction patterns MTJ1 and MTJ2 by a spin-orbit field generated by the first write current Isw1. A magnitude of the spin-orbit torque by the first write current Isw1 may be less than a magnitude of spin-orbit torque required to switch the magnetization direction $MD_{f2}$ of the second free magnetic pattern FL2. Thus, when the spin-orbit torque by the first write current Isw1 is applied to the first and second magnetic tunnel junction patterns MTJ1 and MTJ2, the magnetization direction $MD_{f1}$ of the first free magnetic pattern FL1 may be switched in parallel (or anti-parallel) to the magnetization direction $MD_{p1}$ of the first reference magnetic pattern PL1, but the magnetization direction $MD_{f2}$ of the second free magnetic pattern FL2 may not be switched. In this case, the first magnetic tunnel junction pattern MTJ1 and the second magnetic tunnel junction pattern MTJ2 may store, for example, data of '1' and '0', respectively.

A second write current Isw2 may flow in the second direction D2 through the conductive line 110. The second write current Isw2 may be an in-plane current flowing through the conductive line 110 and may flow in parallel to the interface INF1 between the conductive line 110 and the first magnetic tunnel junction pattern MTJ1 and the interface INF2 between the conductive line 110 and the second magnetic tunnel junction pattern MTJ2. A magnitude (e.g., amount) of the second write current Isw2 may be greater than a magnitude (e.g., amount) of the first write current Isw1 (i.e., Isw2>Isw1). Spin-orbit torque may be applied to the first and second magnetic tunnel junction patterns MTJ1 and MTJ2 by a spin-orbit field generated by the second write current Isw2. A magnitude of the spin-orbit torque by the second write current Isw2 may be greater than a magnitude of the spin-orbit torque by the first write current Isw1. Thus, when the spin-orbit torque by the second write current Isw2 is applied to the first and second magnetic tunnel junction patterns MTJ1 and MTJ2, the magnetization direction $MD_{f1}$ of the first free magnetic pattern FL1 may be switched in parallel (or anti-parallel) to the magnetization direction $MD_{p1}$ of the first reference magnetic pattern PL1, and the magnetization direction $MD_{f2}$ of the second free magnetic pattern FL2 may also be switched in parallel (or anti-parallel) to the magnetization direction $MD_{p2}$ of the second reference magnetic pattern PL2. In this case, the first magnetic tunnel junction pattern MTJ1 and the second magnetic tunnel junction pattern MTJ2 may store, for example, data of '1' and '1', respectively.

A first erase current Iswr1 may flow in a direction anti-parallel to the second direction D2 (i.e., a direction opposite to the second direction D2) through the conductive line 110. The first erase current Iswr1 may be an in-plane current flowing through the conductive line 110 and may flow in parallel to the interface INF1 between the conductive line 110 and the first magnetic tunnel junction pattern MTJ1 and the interface INF2 between the conductive line 110 and the second magnetic tunnel junction pattern MTJ2. The first erase current Iswr1 may be a reverse current of the first write current Isw1. A direction of a spin-orbit field generated by the first erase current Iswr1 may be opposite to a direction of the spin-orbit field generated by the first write current Isw1. Spin-orbit torque may be applied to the first and second magnetic tunnel junction patterns MTJ1 and MTJ2 by the spin-orbit field generated by the first erase current Iswr1. A magnitude of the spin-orbit torque by the first erase current Iswr1 may be less than the magnitude of the spin-orbit torque required to switch the magnetization direction $MD_{f2}$ of the second free magnetic pattern FL2. Thus, when the spin-orbit torque by the first erase current Iswr1 is applied to the first and second magnetic tunnel junction patterns MTJ1 and MTJ2, the magnetization direction $MD_{f1}$ of the first free magnetic pattern FL1 may be switched in anti-parallel (or parallel) to the magnetization direction $MD_{p1}$ of the first reference magnetic pattern PL1, but the magnetization direction $MD_{f2}$ of the second free magnetic pattern FL2 may not be switched. In this case, the first magnetic tunnel junction pattern MTJ1 and the second magnetic tunnel junction pattern MTJ2 may store, for example, data of '0' and '1', respectively.

A second erase current Iswr2 may flow in the direction anti-parallel to the second direction D2 (i.e., the direction opposite to the second direction D2) through the conductive line 110. The second erase current Iswr2 may be an in-plane current flowing through the conductive line 110 and may flow in parallel to the interface INF1 between the conductive line 110 and the first magnetic tunnel junction pattern MTJ1 and the interface INF2 between the conductive line 110 and the second magnetic tunnel junction pattern MTJ2. A magnitude (e.g., amount) of the second erase current Iswr2 may be greater than a magnitude (e.g., amount) of the first erase current Iswr1 (i.e., Iswr2>Iswr1). Spin-orbit torque may be applied to the first and second magnetic tunnel junction patterns MTJ1 and MTJ2 by a spin-orbit field generated by the second erase current Iswr2. A magnitude of the spin-orbit torque by the second erase current Iswr2 may be greater than a magnitude of the spin-orbit torque by the first erase current Iswr1. Thus, when the spin-orbit torque by the second erase current Iswr2 is applied to the first and second magnetic tunnel junction patterns MTJ1 and MTJ2, the magnetization direction $MD_{f1}$ of the first free magnetic pattern FL1 may be switched in anti-parallel (or parallel) to the magnetization direction $MD_{p1}$ of the first reference magnetic pattern PL1, and the magnetization direction $MD_{f2}$ of the second free magnetic pattern FL2 may also be switched in anti-parallel (or parallel) to the magnetization direction $MD_{p2}$ of the second reference magnetic pattern PL2. In this case, the first magnetic tunnel junction pattern MTJ1 and the second magnetic tunnel junction pattern MTJ2 may store, for example, data of '0' and '0', respectively.

A read operation of the first and second magnetic tunnel junction patterns MTJ1 and MTJ2 may be performed by a similar method to those of spin-transfer torque memories. For example, a read current head may flow through the first and second magnetic tunnel junction patterns MTJ1 and MTJ2 in a direction perpendicular to surfaces (or planes) of the first and second magnetic tunnel junction patterns MTJ1 and MTJ2 (e.g., in a direction opposite to the first direction D1). The read current Iread may be controlled by the upper interconnection line 140 connected to the second magnetic tunnel junction pattern MTJ2. Resistance states of the first and second magnetic tunnel junction patterns MTJ1 and MTJ2 may be detected by the read current Iread.

Figure 6:
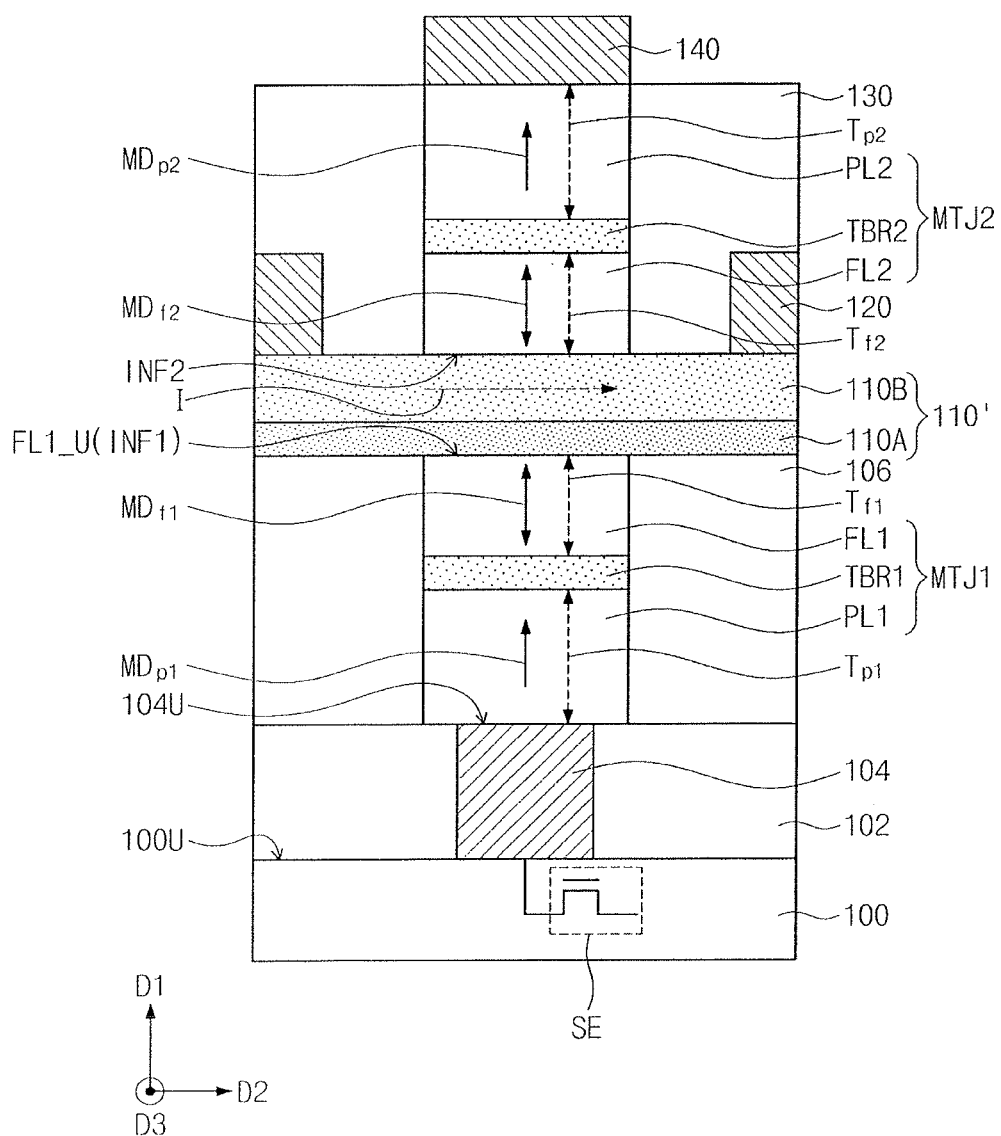
FIG. 6 illustrates a cross-sectional view of a magnetic memory device according to a modified example of some embodiments.

FIG. 6 is a cross-sectional view illustrating a magnetic memory device according to a modified example of some embodiments. Hereinafter, differences between the present modified example and the above embodiments described with reference to FIGS. 4 and 5 will be mainly described for the purpose of ease and convenience in explanation.

Referring to FIG. 6, the conductive line 110' may be disposed on the insulating layer 106 and may be connected to the first magnetic tunnel junction pattern MTJ1. According to the present embodiment, the conductive line 110' may have a multi-layered structure. The conductive line 110' may include the first conductive line 110A and the second conductive line 110B, which are sequentially stacked on the insulating layer 106. The first conductive line 110A may be disposed between the first magnetic tunnel junction pattern MTJ1 and the second conductive line 110B and may be in contact with the top surface FL1_U of the first free magnetic pattern FL1. The first conductive line 110A may extend from the top surface FL1_U of the first free magnetic pattern FL1 onto the top surface 106U of the insulating layer 106 in the second direction D2. The second conductive line 110B may extend in the second direction D2 in parallel to the first conductive line 110A. The first and second conductive lines 110A and 110B may be substantially the same as the first and second conductive lines 110A and 110B described with reference to FIG. 3. In the present embodiment, a portion of the in-plane current I flowing through the conductive line 110' may be spin-polarized by the second conductive line 110B. For example, charge carriers (e.g., electrons) in the second conductive line 110B may be spin-polarized along the direction of the magnetic moment of the second conductive line 110B. The spin-polarized charge carriers may be accumulated in the conductive line 110' near to the first and second magnetic tunnel junction patterns MTJ1 and MTJ2. The spin-orbit torque may be applied to the first and second magnetic tunnel junction patterns MTJ1 and MTJ2 by the accumulation of the spin-polarized charge carriers. The magnetization directions $MD_{f1}$ and $MD_{f2}$ of the first and second free magnetic patterns FL1 and FL2 may be switched by the spin-orbit torque.

A method of operating the magnetic memory device according to the present embodiment is substantially the same as the method of operating the magnetic memory device described with reference to FIG. 5.

Figure 7:
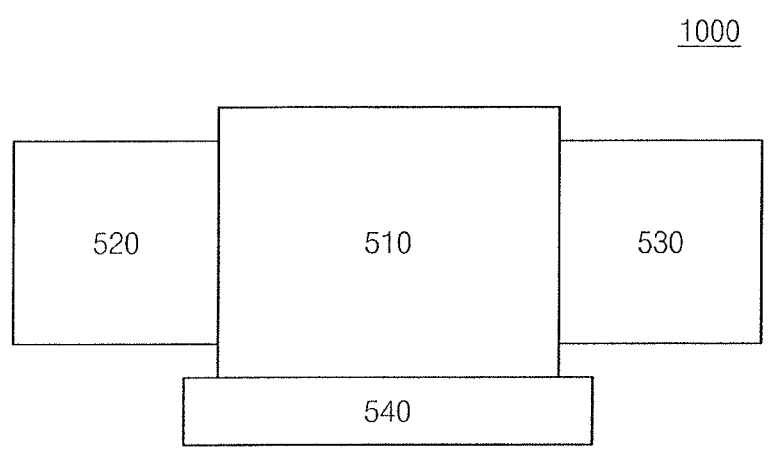
FIG. 7 illustrates a conceptual view of an apparatus used to manufacture a magnetic memory device according to some embodiments.

FIG. 7 is a conceptual view illustrating an apparatus used to manufacture a magnetic memory device according to some embodiments.

Referring to FIG. 7, an apparatus 1000 may include a first process chamber 520, a second process chamber 530, and a buffer module 510 connected therebetween. Each of the first and second process chambers 520 and 530 may be connected to the buffer module 510. The first process chamber 520 may be configured to perform a physical etching process using an ion beam therein. The ion beam may include, e.g., argon positive ions (Ar⁺). The second process chamber 530 may be configured to perform a physical deposition process (e.g., a sputtering deposition process) therein. For example, the second process chamber 530 may include a plurality of targets disposed therein, and a sputtering deposition process using the plurality of targets may be performed in the second process chamber 530. The first and second process chambers 520 and 530 and the buffer module 510 may be in a vacuum state.

The apparatus 1000 may further include a load port module 540 for receiving a wafer provided from the outside, and the load port module 540 may be connected to the buffer module 510. The wafer may be provided into the apparatus 1000 through the load port module 540. The wafer may be moved from the load port module 540 into the buffer module 510 and then may be moved into the first process chamber 520 or the second process chamber 530 through the buffer module 510. The wafer may be moved to the load port module 540 through the buffer module 510 and may be exported from the load port module 540 to the outside of the apparatus 1000.

FIGS. 8 to 11 are cross-sectional views illustrating stages in a method of manufacturing a magnetic memory device, according to some embodiments. Hereinafter, the descriptions to the same features as described with reference to FIG. 1 will be omitted or mentioned only briefly for the purpose of ease and convenience in explanation. The selection element is omitted for the purpose of ease and convenience in illustration.

Figure 8:
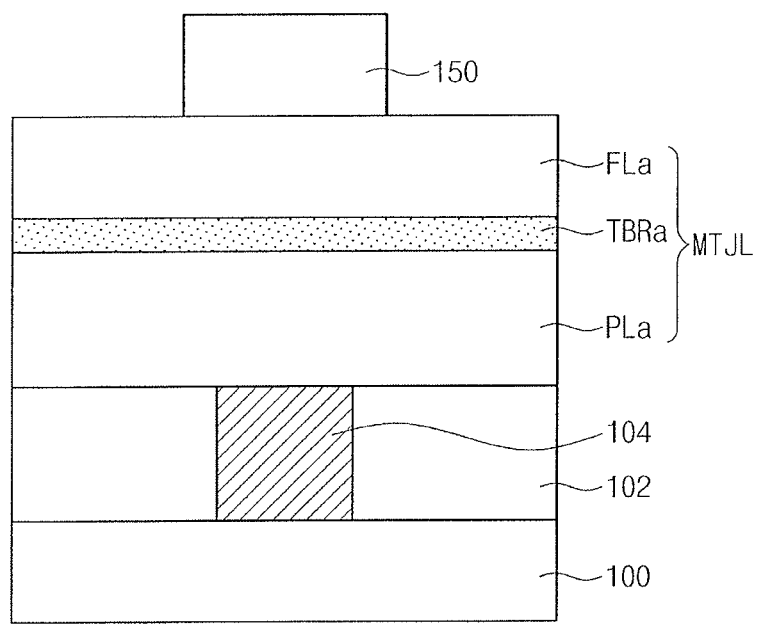
FIGS. 8 to 11 illustrate cross-sectional views of stages in a method of manufacturing a magnetic memory device, according to some embodiments.

Referring to FIG. 8, the lower interlayer insulating layer 102 may be formed on the substrate 100. The substrate 100 may include a semiconductor substrate and a selection element (see SE of FIG. 1) formed on the semiconductor substrate. The lower contact plug 104 may be formed in the lower interlayer insulating layer 102. For example, the formation of the lower contact plug 104 may include forming a lower contact hole penetrating the lower interlayer insulating layer 102, forming a contact conductive layer filling the lower contact hole, and planarizing the contact conductive layer until the lower interlayer insulating layer 102 is exposed. The lower contact plug 104 may be connected to one terminal of the selection element.

A magnetic tunnel junction layer MTJL may be formed on the lower interlayer insulating layer 102. The magnetic tunnel junction layer MTJL may include a reference magnetic layer PLa, a tunnel barrier layer TBRa, and a free magnetic layer FLa, which are sequentially stacked on the lower interlayer insulating layer 102. Each of the reference magnetic layer PLa and the free magnetic layer FLa may include at least one magnetic layer. Each of the reference magnetic layer PLa, the tunnel barrier layer TBRa and the free magnetic layer FLa may be formed by a sputtering method or a chemical vapor deposition (CVD) method.

A mask pattern 150 may be formed on the magnetic tunnel junction layer MTJL, e.g., the mask pattern 150 may be formed directly on the free magnetic layer Fla of the magnetic tunnel junction layer MTJL. The mask pattern 150 may define a region in which a magnetic tunnel junction pattern will be formed. For example, the mask pattern 150 may include at least one of a metal (e.g., Ta, W, Ru, or Ir), a conductive metal nitride (e.g., TiN), an oxide, a nitride, or an oxynitride.

Figure 9:
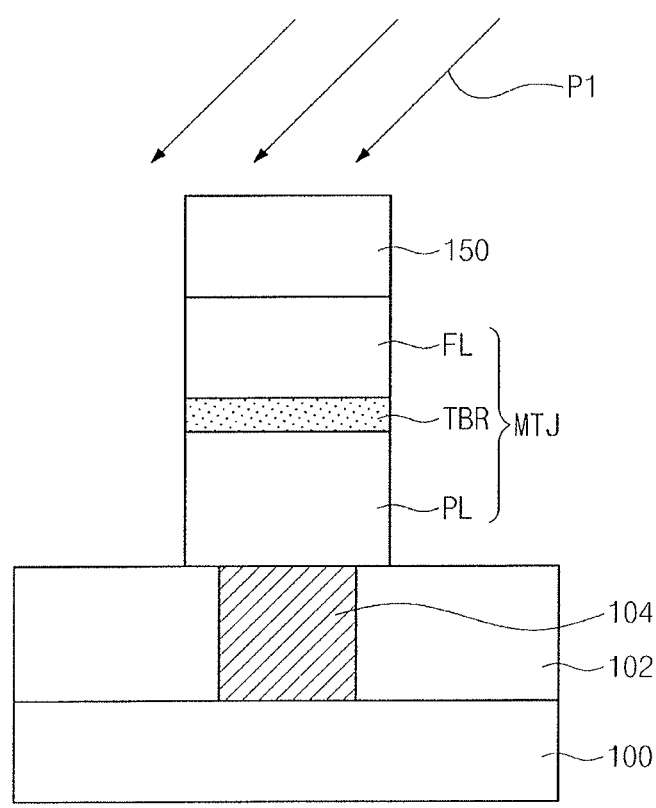

Referring to FIG. 9, the magnetic tunnel junction layer MTJL may be etched using the mask pattern 150 as an etch mask by a first etching process P1, and thus the magnetic tunnel junction pattern MTJ may be formed. The first etching process P1 may be, e.g., an ion beam etching process using an ion beam. The ion beam may include, e.g., argon positive ions (Ar⁺). The magnetic tunnel junction pattern MTJ may include a reference magnetic pattern PL, a tunnel barrier pattern TBR, and a free magnetic pattern FL, which are sequentially stacked on the lower interlayer insulating layer 102. The reference magnetic pattern PL, the tunnel barrier pattern TBR, and the free magnetic pattern FL may be formed by etching the reference magnetic layer PLa, the tunnel barrier layer TBRa, and the free magnetic layer FLa through the first etching process P1, respectively.

Figure 10:
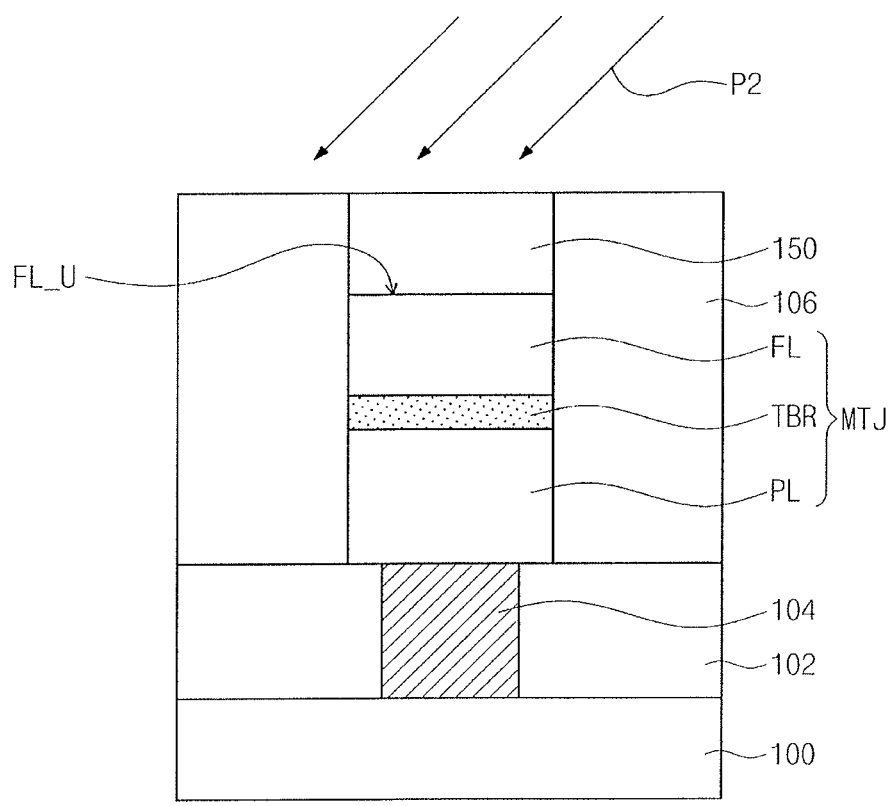

Referring to FIGS. 7 and 10, the insulating layer 106 may be formed on the lower interlayer insulating layer 102 and may cover the magnetic tunnel junction pattern MTJ and the mask pattern 150. The substrate 100 having the insulating layer 106 may be provided into the apparatus 1000 through the load port module 540 of FIG. 7. The substrate 100 having the insulating layer 106 may be moved from the load port module 540 into the buffer module 510 and then may be provided into the first process chamber 520 through the buffer module 510. A second etching process P2 may be performed in the first process chamber 520. The second etching process P2 may be, e.g., an ion beam etching process using an ion beam. The ion beam may include, e.g., argon positive ions (Ar$^+$). The second etching process P2 may be an etch-back process for removing the mask pattern 150 and an upper portion of the insulating layer 106. The second etching process P2 may be performed until a top surface of the free magnetic pattern FL is exposed, e.g., the second etching process P2 may be performed to have top surfaces of the free magnetic pattern FL and the insulating layer 106 flat and coplanar.

Figure 11:
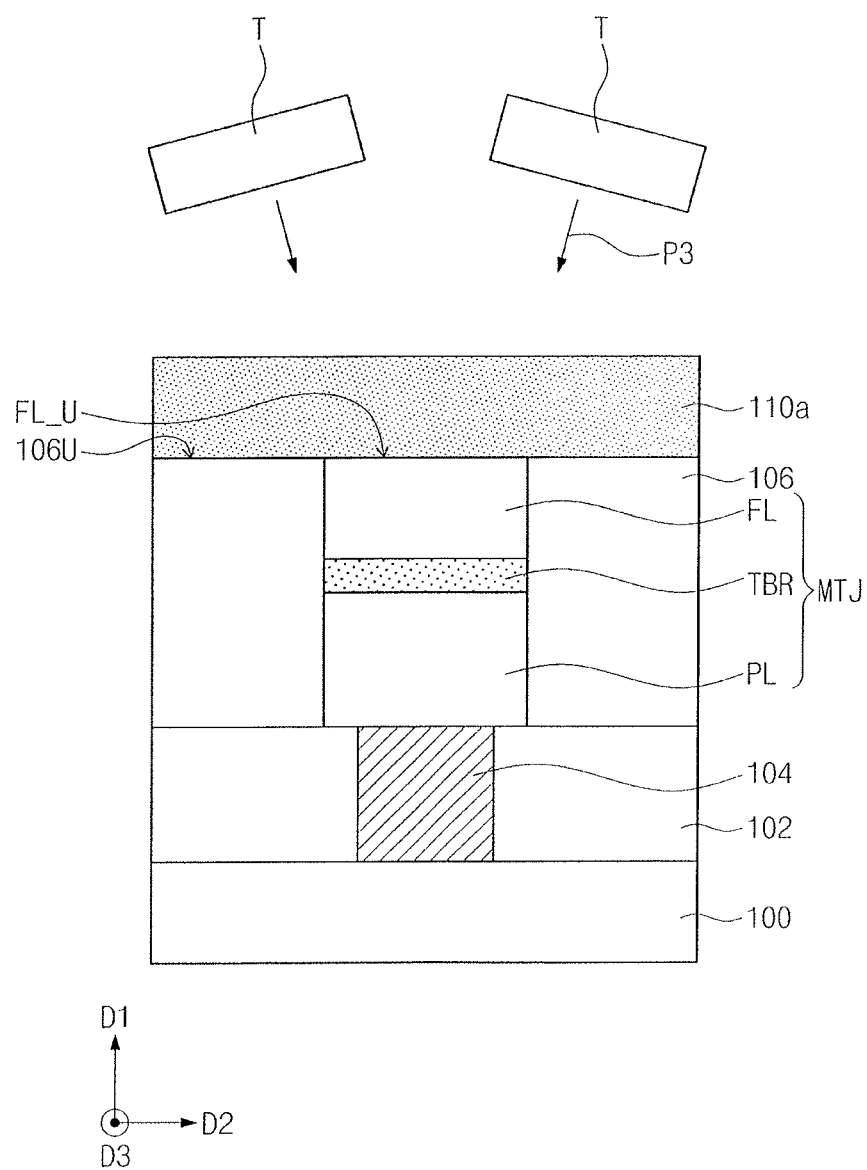

Referring to FIGS. 7 and 11, the top surface FL_U of the free magnetic pattern FL may be disposed at substantially the same height as a top surface 106U of the insulating layer 106 by the second etching process P2. After the second etching process P2 is finished, the substrate 100 may be moved from the first process chamber 520 into the buffer module 510 and then may be moved from the buffer module 510 into the second process chamber 530. In this case, the first process chamber 520, the buffer module 510, and the second process chamber 530 may all be in a vacuum state, e.g., so during movement of the substrate 100 between chambers there is no exposure to air.

A deposition process P3 may be performed in the second process chamber 530. The deposition process P3 may be a sputtering deposition process using at least one target T. A conductive layer 110a may be formed on the insulating layer 106 by the deposition process P3. The conductive layer 110a may be in contact with the top surface FL_U of the free magnetic pattern FL and may extend from the top surface FL_U of the free magnetic pattern FL onto the top surface 106U of the insulating layer 106. In some embodiments, the conductive layer 110a may have a multi-layered structure. For example, the conductive layer 110a may include a first conductive layer and a second conductive layer which are sequentially stacked on the insulating layer 106. The first conductive layer may include a non-magnetic metal element, and the second conductive layer may include a magnetic element. In this case, the deposition process P3 may be a sputtering deposition process using a plurality of targets T.

The substrate 100 having the conductive layer 110a may be moved from the second process chamber 530 into the buffer module 510 and then may be moved from the buffer module 510 to the load port module 540. The substrate 100 having the conductive layer 110a may be exported from the load port module 540 to the outside of the apparatus 1000.

Referring again to FIG. 1, the conductive layer 110a may be patterned to form the conductive line 110. When the conductive layer 110a has the multi-layered structure, the conductive line 110' with the first conductive line 110A and the second conductive line 110B, as described with reference to FIG. 3, may be formed. Thereafter, the interconnection lines 120 may be formed to be connected to different portions of the conductive line 110, respectively.

If the conductive line 110 were to be disposed under the magnetic tunnel junction pattern MTJ, e.g., if the conductive line 110 were to be disposed between the magnetic tunnel junction pattern MTJ and the substrate 100, portions of the conductive line 110 at both sides of the magnetic tunnel junction pattern MTJ could have been damaged, e.g., recessed or cut due to over-etching, during an etching process (e.g., the first etching process P1) for forming the magnetic tunnel junction pattern MTJ. In this case, efficiency of spin-orbit torque generated by a current flowing through the conductive line 110 would have been reduced.

In contrast, according to some example embodiments, the conductive line 110 is disposed on the magnetic tunnel junction pattern MTJ, e.g., above the top surface of the magnetic tunnel junction pattern MTJ. Thus, the conductive line 110 is formed after formation of the magnetic tunnel junction pattern MTJ is complete, and has a flat structure, e.g., a top surface of the conductive line 110 may be substantially flat and parallel to a bottom of the substrate 100.

Accordingly, the position of conductive line 110 above the magnetic tunnel junction pattern MTJ according to example embodiments may prevent the conductive line 110 from being recessed or cut during the etching process (e.g., the first etching process P1) for forming the magnetic tunnel junction pattern MTJ, thereby maximizing the efficiency of spin-orbit torque generated by a current flowing through the flat conductive line 110 and reducing short failures, e.g., potentially caused by residual ions after etching.

In addition, the conductive line 110 may be formed by performing the second etching process P2 of exposing the top surface FL_U of the free magnetic pattern FL of the magnetic tunnel junction pattern MTJ and the deposition process P3 of depositing the conductive layer 110a on the exposed top surface FL_U of the free magnetic pattern FL. The second etching process P2 and the deposition process P3 may be performed in a single apparatus 1000 in the vacuum state, and thus a natural oxide layer may not be formed between the conductive layer 110a and the top surface FL_U of the free magnetic pattern FL. In other words, a natural oxide layer may not exist at an interface INF between the conductive line 110 and the magnetic tunnel junction pattern MTJ. As a result, the efficiency of spin-orbit torque generated by a current flowing through the conductive line 110 may be increased, and thus the switching property of the magnetic memory device may be improved.

Figure 12:
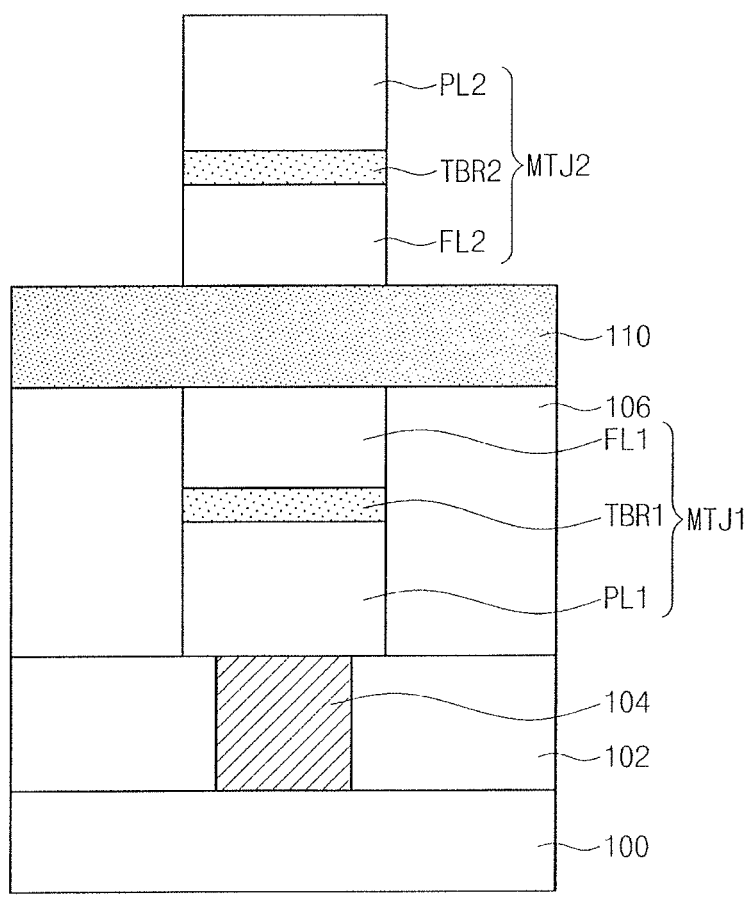
FIG. 12 illustrates a cross-sectional view of a stage in a method of manufacturing a magnetic memory device, according to some embodiments.

FIG. 12 is a cross-sectional view illustrating a method of manufacturing a magnetic memory device, according to some embodiments. Hereinafter, the descriptions to the same features as described with reference to FIG. 4 will be omitted or mentioned only briefly for the purpose of ease and convenience in explanation. The selection element is omitted for the purpose of ease and convenience in illustration.

The structure formed by the method described with reference to FIGS. 8 to 11 may be provided. The magnetic tunnel junction pattern MTJ may be referred to as a first magnetic tunnel junction pattern MTJ1. The reference magnetic pattern PL, the tunnel barrier pattern TBR, and the free magnetic pattern FL may be referred to as a first reference magnetic pattern PL1, a first tunnel barrier pattern TBR1, and a first free magnetic pattern FL1, respectively. The conductive layer 110a may be patterned to form the conductive line 110. When the conductive layer 110a has the multi-layered structure, the conductive line 110' may include the first conductive line 110A and the second conductive line 110B described with reference to FIG. 6.

The second magnetic tunnel junction pattern MTJ2 may be formed on the conductive line 110. The second magnetic tunnel junction pattern MTJ2 may be formed by substantially the same method as the first magnetic tunnel junction pattern MTJ1. The second magnetic tunnel junction pattern MTJ2 may include a second free magnetic pattern FL2, a second tunnel barrier pattern TBR2, and a second reference magnetic pattern PL2, which are sequentially stacked on the conductive line 110. According to FIGS. 4-6, the conductive line 110 may be recessed during the patterning of the second MTJ (MTJ2) to provide a magnetic memory device including a multi-bit memory cell, as will be discussed in more detail below.

Referring again to FIG. 4, the interconnection lines 120 may be formed to be connected to different portions of the conductive line 110, respectively. The upper interlayer insulating layer 130 may be formed to cover the second magnetic tunnel junction pattern MTJ2 and the interconnection lines 120, and the upper interconnection line 140 may be formed on the upper interlayer insulating layer 130. The upper interconnection line 140 may be connected to the second magnetic tunnel junction pattern MTJ2.

According to some embodiments, the conductive line 110 may be disposed between the first and second magnetic tunnel junction patterns MTJ1 and MTJ2 and may be configured to apply the spin-orbit torque to the first and second magnetic tunnel junction patterns MTJ1 and MTJ2. The first magnetic tunnel junction pattern MTJ1 and the second magnetic tunnel junction pattern MTJ2 may be formed to have different switching properties. In this case, switching operations of the first and second magnetic tunnel junction patterns MTJ1 and MTJ2 may be controlled by changing a magnitude of a current flowing through the conductive line 110. Thus, the magnetic memory device including a multi-bit memory cell may be provided.

By way of summation and review, embodiments provide magnetic memory devices with improved switching properties and methods of manufacturing the same. Embodiments also provide magnetic memory devices including multi-bit memory cells and methods of manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with an embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a magnetic memory device, comprising:
forming a magnetic tunnel junction pattern on a substrate;
forming an insulating layer covering the magnetic tunnel junction pattern on the substrate;
performing an etching process to expose a top surface of the magnetic tunnel junction pattern, the etching process being performed in a first process chamber; and
performing a deposition process to form a conductive layer on the top surface of the magnetic tunnel junction pattern, the deposition process being performed in a second process chamber;
wherein the first process chamber and the second process chamber are connected to each other through a buffer module.

2. The method as claimed in claim 1, wherein the magnetic tunnel junction pattern includes a free magnetic pattern, a reference magnetic pattern between the free magnetic pattern and the substrate, and a tunnel barrier pattern between the free magnetic pattern and the reference magnetic pattern, and
wherein the etching process is performed to expose a top surface of the free magnetic pattern.

3. The method as claimed in claim 2, wherein the deposition process is performed to form the conductive layer on the top surface of the free magnetic pattern, and the conductive layer is in contact with the top surface of the free magnetic pattern.

4. The method as claimed in claim 2, wherein the etching process is an ion beam etching process using an ion beam.

5. The method as claimed in claim 2, wherein a top surface of the insulating layer is coplanar with the top surface of the free magnetic pattern by the etching process.

6. The method as claimed in claim 5, wherein the conductive layer extends from the top surface of the free magnetic pattern onto the top surface of the insulating layer.

7. The method as claimed in claim 2, wherein the deposition process is a sputtering deposition process using at least one target.

8. The method as claimed in claim 1, further comprising:
moving the substrate from the first process chamber into the second process chamber passing through the buffer module, after the etching process,
wherein the buffer module are in a vacuum state during movement of the substrate.

9. The method as claimed in claim 1, further comprising:
providing the substrate having the insulating layer into an apparatus before performing the etching process,
wherein the etching process is performed in the first process chamber of the apparatus, the deposition process is performed in the second process chamber of the apparatus, and the first process chamber and the second process chamber are connected to each other through the buffer module of the apparatus.

10. The method as claimed in claim 1, further comprising:
forming a conductive line by patterning the conductive layer, the conductive line extending in a direction parallel to an upper surface of the substrate, and
forming interconnection lines connected to different portions of the conductive line, respectively.

11. A method for manufacturing a magnetic memory device, comprising:
forming a magnetic tunnel junction layer on a substrate;
forming a mask pattern on the magnetic tunnel junction layer;
forming a magnetic tunnel junction pattern by performing a first etching process to etch the magnetic tunnel junction layer using the mask pattern as an etch mask;
forming an insulating layer covering the magnetic tunnel junction pattern and the mask pattern on the substrate;
removing the mask pattern and an upper portion of the insulating layer by performing a second etching process, and
forming a conductive layer on the magnetic tunnel junction pattern by performing a deposition process,
wherein the second etching process is performed to expose a top surface of the magnetic tunnel junction pattern, and
wherein the conductive layer is in contact with the top surface of the magnetic tunnel junction pattern.

12. The method as claimed in claim 11, wherein the magnetic tunnel junction pattern includes a free magnetic pattern, a reference magnetic pattern between the free magnetic pattern and the substrate, and a tunnel barrier pattern between the free magnetic pattern and the reference magnetic pattern, and wherein the second etching process is performed to expose a top surface of the free magnetic pattern.

13. The method as claimed in claim 12, wherein the conductive layer is in contact with the top surface of the free magnetic pattern.

14. The method as claimed in claim 12, wherein a top surface of the insulating layer is at a same height as the top surface of the free magnetic pattern by the second etching process.

15. The method as claimed in claim 14, wherein the conductive layer extends from the top surface of the free magnetic pattern onto the top surface of the insulating layer.

16. The method as claimed in claim 11, wherein each of the first etching process and the second etching process is an ion beam etching process using an ion beam.

17. The method as claimed in claim 16, wherein the deposition process is a sputtering deposition process using at least one target.

18. The method as claimed in claim 11, wherein the second etching process is performed in a first process chamber of an apparatus, and the deposition process is performed in a second process chamber of the apparatus, and wherein the first process chamber and the second process chamber are connected to each other through a buffer module of the apparatus.

19. The method as claimed in claim 18, further comprising:

moving the substrate from the first process chamber into the second process chamber passing through the buffer module, after the second etching process, wherein the first process chamber, the second process chamber, and the buffer module are in a vacuum state during movement of the substrate.

20. The method as claimed in claim 11, further comprising:

forming a conductive line by patterning the conductive layer, the conductive line extending in a direction parallel to an upper surface of the substrate, and forming interconnection lines connected to different portions of the conductive line, respectively.

* * * * *

UNITED STATES PATENT AND TRADEMARK OFFICE
CERTIFICATE OF CORRECTION

PATENT NO.         : 10,553,790 B1
APPLICATION NO.    : 16/440461
DATED              : February 4, 2020
INVENTOR(S)        : Joonmyoung Lee et al.

It is certified that error appears in the above-identified patent and that said Letters Patent is hereby corrected as shown below:

On the Title Page

Item (54) and in the Specification, Column 1, Lines 1-2, should read:
METHOD OF MANUFACTURING A MAGNETIC MEMORY DEVICE Signed and Sealed this
Seventeenth Day of March, 2020

Andrei Iancu
*Director of the United States Patent and Trademark Office*